United States Patent [19]

Minato et al.

[11] 4,280,065
[45] Jul. 21, 1981

[54] TRI-STATE TYPE DRIVER CIRCUIT

[75] Inventors: Osamu Minato, Kokubunji; Toshiaki Masuhara, Hachioji; Toshio Sasaki, Hachioji; Masaharu Kubo, Hachioji, all of Japan

[73] Assignee: Hitachi, Ltd., Tokyo, Japan

[21] Appl. No.: 969,269

[22] Filed: Dec. 14, 1978

[30] Foreign Application Priority Data

Dec. 26, 1977 [JP] Japan .................. 52-155570

[51] Int. Cl.³ .................. H03K 3/01; H03K 19/08
[52] U.S. Cl. .................. 307/473; 307/448; 307/270; 307/454
[58] Field of Search .......... 307/209, 270, 264, 251, 307/279, 205, 214

[56] References Cited

U.S. PATENT DOCUMENTS

| | | | |
|---|---|---|---|
| 3,832,576 | 8/1974 | Proebing | 307/209 |
| 3,963,946 | 6/1976 | Zajac | 307/270 |
| 4,176,272 | 11/1979 | Power | 307/270 |

*Primary Examiner*—Stanley D. Miller, Jr.
*Assistant Examiner*—B. P. Davis
*Attorney, Agent, or Firm*—Craig and Antonelli

[57] ABSTRACT

This invention relates to a tri-state type driver circuit in which any one of the three possible output signals of "float", "on", or "off" is produced at high speed even when an output terminal is accompanied with a great load. The tri-state type driver circuit comprises an output inverter circuit which employs a bipolar transistor as a load thereof and a MOS-FET as a driver thereof, a first logical circuit which is coupled to an input terminal of the bipolar transistor, which first logical circuit is made up of a C-MOS circuit receiving an external select signal and a C-MOS circuit having an input signal transmitted thereto and whose output can be specified by the external select signal, and a second logical circuit which is coupled to an input terminal of the MOS-FET, which second logical circuit is made up of a C-MOS circuit receiving the external select signal and a C-MOS circuit having the input signal transmitted thereto.

13 Claims, 6 Drawing Figures

TRI-STATE TYPE DRIVER CIRCUIT

BACKGROUND OF THE INVENTION

This invention relates to a semiconductor driver circuit which is based on metal insulator-oxide field effect transistors (hereinbelow, abbreviated to "MOS-FET's") and further includes a bipolar transistor in combination therewith, which driver circuit has an operating speed higher than in prior art driver circuits.

Heretofore, in a C-MOS (Complementary-MOS) circuit wherein an enhancement type P-channel MOS-FET and an enhancement type N-channel MOS-FET are simultaneously integrated in an identical chip, a driver circuit as shown in FIG. 1 has been employed. Referring to the figure, numeral 1 designates an input terminal, numeral 2 an output terminal which is accompanied with a load capacitance 3, and numeral 4 a power supply terminal. $P_1$ indicates a P-channel MOS-FET, while $N_1$ indicates an N-channel MOS-FET. $V_{DD}$ denotes a positive supply voltage. The C-MOS driver circuit composed of the MOS-FET's ($P_1$, $N_1$) has the disadvantage that the load capacitance 3 is large and that in a case of driving it at high speed, the dimension (for example, channel width W) of the MOS-FET $P_1$ must be made large. Accordingly, the area occupied by the driver circuit becomes large, which is a serious loss with regard to the density of integration.

The inventors have therefore provided an improved driver circuit shown in FIG. 2 in Japanese Patent Application No. 52-1490. Referring to the figure, $P_2$ designates a P-channel MOS-FET whose drain and source are highly doped p-type layers formed in an n-type semiconductor substrate. Each of $N_2$ and $N_3$ indicates an N-channel MOS-FET whose drain and source are highly doped n-type layers formed within a well of a p-type layer provided in the surface of the substrate. Shown at $B_1$ is a planar type bipolar transistor whose base is a p-type layer provided in the surface region of the substrate, whose collector is the substrate and whose emitter is a highly doped n-type layer provided within the base of the p-type layer. Characteristic of the prior art in FIG. 2 is that the bipolar transistor is integrated on the same chip and that a driver circuit is constructed of interconnections illustrated in the figure. When the input terminal 1 is at the ground potential, the MOS-FET's $N_2$ and $N_3$ are nonconductive, whereas the MOS-FET $P_2$ is conductive. Current flows from the power supply terminal 4 to the base of the bipolar transistor $B_1$, and the bipolar transistor $B_1$ becomes conductive, so that the output terminal 2 is charged to a high potential.

When the input terminal 1 is at a high potential, the MOS-FET $P_2$ is rendered nonconductive and also the bipolar transistor $B_1$ is rendered nonconductive, and the MOS-FET $N_2$ is rendered conductive, so that the output terminal becomes the ground potential. In the transition of the input terminal 1 from the high potential to the ground potential, high current flows from the power supply terminal 4 and through the bipolar transistor $B_1$, and the load capacitance 3 can be charged at high speed.

For the transistor $P_2$, only a driving capability enough to charge the junction capacitance which is formed by the base and collector of the transistor $B_1$, is needed. As a result, the size of the transistor $P_2$ becomes small, and the area occupied by the driver circuit is reduced. Besides, the base width of the bipolar transistor $B_1$ can be made small in such a way that the diffusion depth of the highly doped n-type layer which is to become the emitter of the bipolar transistor $B_1$ is made greater than the diffusion depth of the highly doped n-type layers which are to become the source and drain of the ordinary N-channel MOS-FET. In this case, the bipolar transistor $B_1$ has a small base width and a high current gain $h_{FE}$, which contributes further greatly to the enhancement of the operating speed of the driver circuit.

The N-channel MOS-FET $N_3$ serves to abruptly lower the potential of the base of the bipolar transistor $B_1$ to the ground potential through this transistor $N_3$ at the time of the transition of the potential of the input terminal 1 from the ground potential to the high potential. This is advantageous for enhancing the operating speed and reducing the power dissipation.

FIG. 3 is a circuit connection diagram of a modification of the driver circuit in FIG. 2. A P-channel MOS-FET $P_3$ can raise the potential of the output terminal 2 up to the supply voltage $V_{DD}$ when the input terminal 1 lies at the ground potential. Thus, it enhances the operating performance of a succeeding circuit connected to the output terminal 2.

The prior art devices illustrated in FIGS. 2 and 3 can provide driver circuits which occupy only a small area and have high speed performance. It is a disadvantage of these driver circuits, however, that when they are employed as an output buffer circuit etc., they cannot be used as the so-called tri-state or three-state type which assumes the three values of logic "0", "1" and "float".

More specifically, in a case where the capacity is made large by the use of a large number of IC memories which are constructed of limited works, the OR of information read out from the respective IC memories needs to be taken in points of the packaging space and the price. In order to make it possible to construct the so-called wired OR with which the OR function can be realized merely by connecting the output terminals by an electric wire, the data output circuits of the respective memory IC's must be constructed by the tri-state system. That is, it is required that only an IC memory chip selected by a chip select signal is connected with a data bus, whereas the others are disconnected from the data bus and are in the float or high impedance state.

SUMMARY OF THE INVENTION

This invention has been made with note taken of the above fact, and has for its object to provide a tri-state type driver circuit in which an output signal is settled into at a high speed even when a large output terminal capacitance exists.

In order to accomplish this object, this invention constructs a driver circuit comprising an output inverter circuit which employs a bipolar transistor as a load and a MOS-FET as a driver. A first logical circuit is coupled with an input terminal of the bipolar transistor. This first logical circuit is made up of a C-MOS circuit receiving an external select signal and a C-MOS circuit having an input signal transmitted thereto and whose output can be specified by the external select signal. A second logical circuit is coupled with an input terminal of the MOS-FET, which second logical circuit is made up of a C-MOS circuit receiving the external select signal and a C-MOS circuit having the input signal transmitted thereto and whose output can be specified by the external select signal. A C-MOS inverter is coupled with the second logical circuit and functions to invert the input signal. The select signal is sometimes called "tristate control signal".

DETAILED DESCRIPTION OF THE PREFERRED EMBODIMENTS

Hereunder, this invention will be described in detail with reference to the illustrated embodiments.

Figure 4:
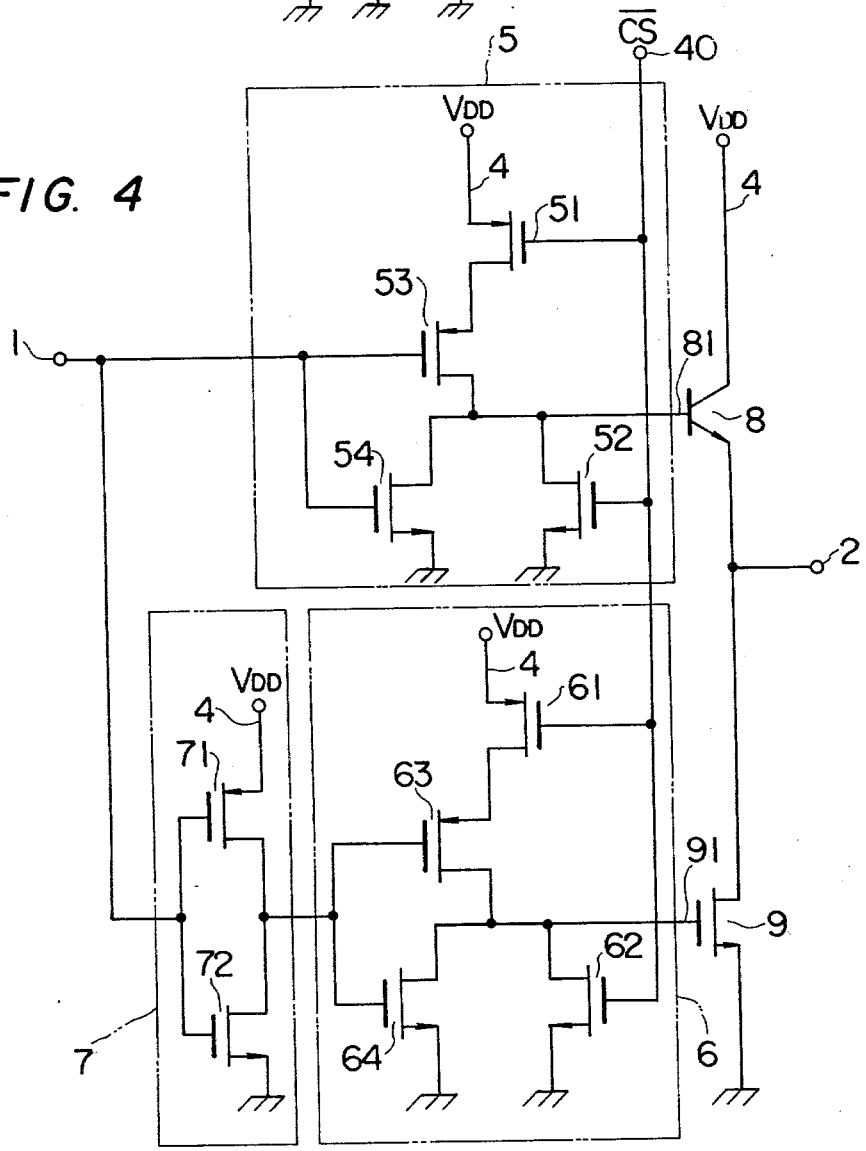
FIG. 4 is a circuit diagram showing an embodiment of this invention.

FIG. 4 is a diagram showing the first embodiment of this invention. C-MOS circuits 5 and 6 are disposed at a stage preceding an output inverter circuit composed of transistors 8 and 9, to form a NOR circuit for a chip select signal $\overline{CS}$ to be impressed on a terminal 40 and an input signal. Thus, when the signal $\overline{CS}$ is at a high level ("1", that is, a positive voltage which is not lower than the threshold value of each C-MOS circuit (51, 52) or (61, 62), for example, a voltage at the level of a supply voltage $V_{DD}$), the P-channel MOS transistors 51 and 61 are in the "off" state, whereas the N-channel MOS transistors 52 and 62 are in the "on" state. The base 81 of the bipolar transistor 8 and the gate 91 of the N-channel MOS transistor 9 are always set at the low potential, and the transistors 8 and 9 are always kept in the cut-off state, so that an output terminal 2 is in a float state. On the other hand, when the signal $\overline{CS}$ is at a low level ("0", that is, a voltage lower than the threshold voltage of each C-MOS circuit (51, 52), or (61, 62), for example, the ground potential or zero voltage), the transistors 51 and 61 are in the "on" state, whereas the transistors 52 and 62 are in the "off" state, and the circuit provides an output corresponding to the input signal, at an input terminal 1. More specifically, when the signal of the input terminal 1 is "0" (a low level signal, that is, a voltage lower than the threshold voltage of each C-MOS circuit (53, 54) or (63, 64), for example, the earth potential or zero volt), a signal "1" (the high level, i.e., the supply voltage $V_{DD}$) appears at the output terminal 2. Further, when the input terminal signal is of "1" (a high level, that is, a positive voltage signal which is not lower than the threshold value of each C-MOS circuit (53, 54) or (63, 64), for example, the $V_{DD}$ level), a signal of "0" (the low level, i.e., the ground voltage or zero voltage) appears at the output terminal 2.

In the manner described above, the circuit of FIG. 4 is so constructed that while it maintains high speed operation, its output terminal can assume the desired three values of a tri-state circuit. Moreover, the area occupied by the circuit is held to a minimum.

Figure 1:
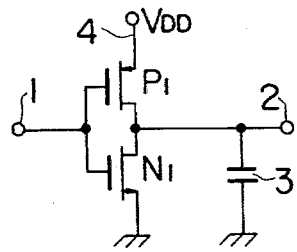
FIGS. 1, 2 and 3 are diagrams each showing a prior-art C-MOS driver circuit.
Figure 2:
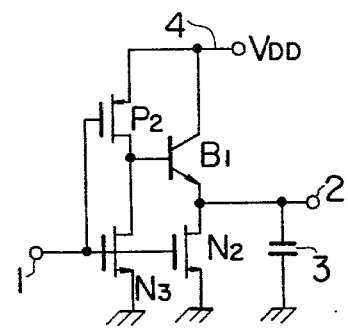
Figure 3:
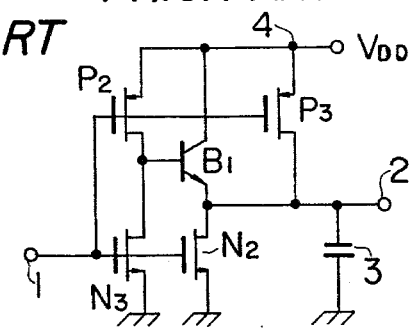

In FIG. 4, numeral 7 designates a C-MOS inverter which is composed of a P-channel MOS transistor 71 and an N-channel MOS transistor 72. Further, in the figure, the P-channel MOS transistors 53 and 63 correspond to the transistor $P_2$ in the circuit of FIG. 2, and the N-channel transistor 54 corresponds to the transistor $N_3$ in the circuit of FIG. 2.

On the other hand, in a case where the output terminal capacitance is large and where the circuit needs to be driven at high speed, inevitably the configurations (for example, channel widths) of the P-channel MOS-FET's 51 and 53 or 61 and 63, respectively, connected in cascade in the circuits 5 and 6 must be made large. This increases the area occupied by the circuit itself.

Figures 5, 6:
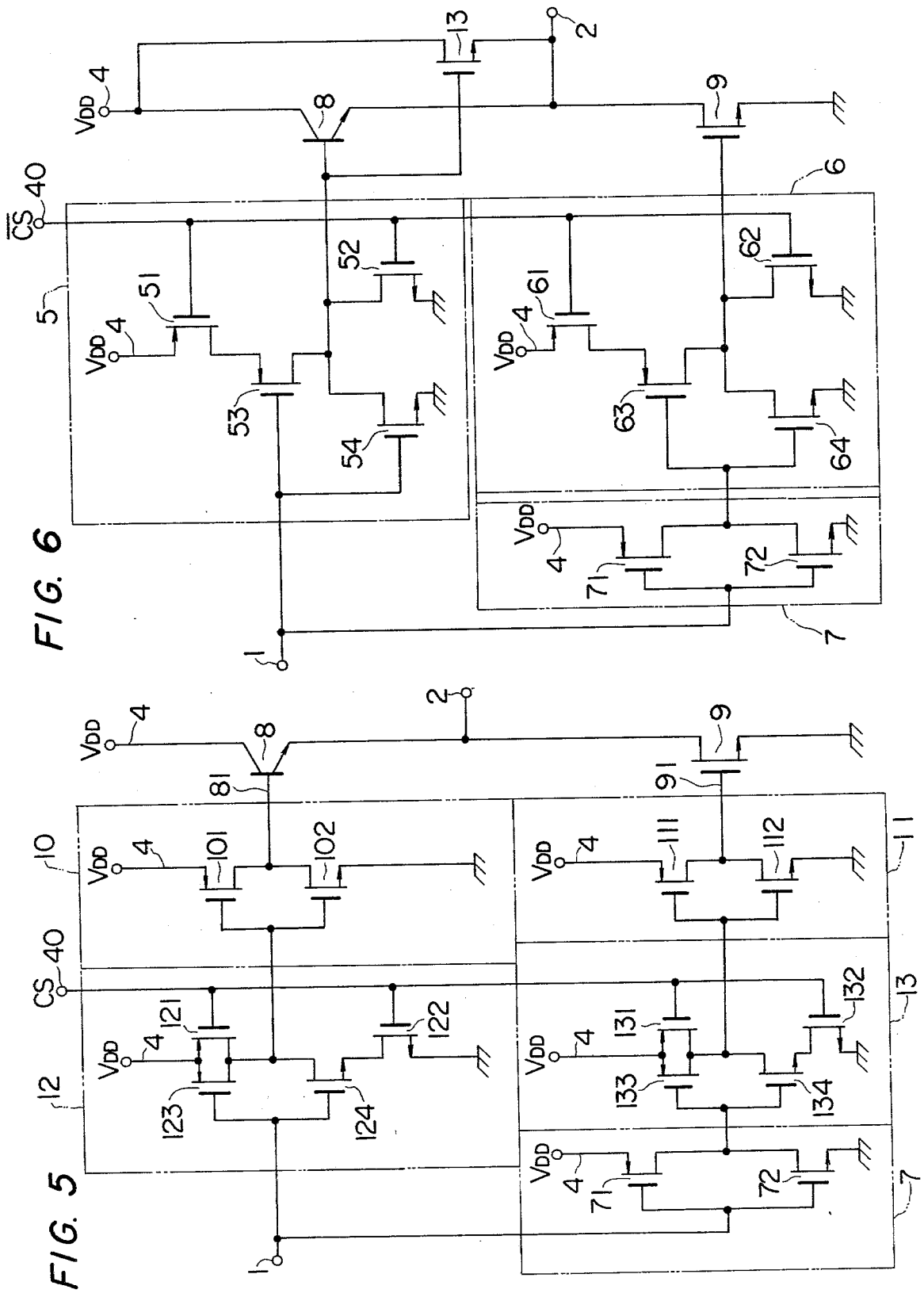
FIGS. 5 and 6 are circuit diagrams each showing another embodiment of this invention.

In another embodiment shown in FIG. 5, C-MOS inverter circuits 10 and 11 are respectively disposed as buffers between an output inverter circuit composed of transistors 8 and 9 and a logical circuit 12 and between the output inverter circuit and a logical circuit 13. Thus, a tri-state type output buffer circuit is realized which occupies a small area and which can be driven at high speed.

In the circuit of FIG. 5, numerals 71, 101, 111, 121, 131, 123 and 133 designate enhancement type P-channel MOS-FET's, and numerals 72, 102, 112, 122, 132, 124 and 134 designate enhancement type N-channel MOS-FET's. The MOS-FET's constitute C-MOS circuits (71, 72), (101, 102), (111, 112), (121, 122), (123, 124), (131, 132) and (133, 134). Thus, when a chip select signal $\overline{CS}$ is at a high level, the transistors 121 and 131 are in an "off" stage, and the transistors 122 and 132 are in an "on" state. An input signal is transmitted to the base 81 of the transistor 8 through the two sets of C-MOS inverters (123, 124) and (101, 102), while it is transmitted to the gate 91 of the transistor 9 through the three sets of C-MOS inverters (71, 72), (133, 134) and (101, 102). The circuit provides an output corresponding to the input signal. That is, if the input signal is "0", the output signal becomes "0", and if the input signal is "1", the output signal becomes "1". On the other hand, when the chip select signal $\overline{CS}$ is at a low level (the same as CS), the transistors 121 and 131 enter an "on" state, and the transistors 122 and 123 enter an "off" state. The outputs of the C-MOS circuits (121, 122) and (131, 132) are set to "1", and the base 81 of the transistor 8 and the gate 91 of the transistor 9 are set to the ground potential, therefore, the transistors 8 and 9 are held in the cut-off state. Correspondingly, an output terminal 2 is in the "float" state.

FIG. 6 shows still another embodiment of this invention, in which a N-channel MOS-FET 13 is added to the circuit of FIG. 4, in which the gate of the MOS-FET 13 is connected to the base of the transistor 8, the source of the MOS-FET 13 is connected to the emitter of the transistor 8 and the drain of the MOS-FET 13 is connected to the supply voltage $V_{DD}$, the other parts being the same as in FIG. 4.

Thus, when the transistor 8 is in the "on" state and the transistor 9 is in the "off" state, the potential of the output terminal 2 is raised up to the supply voltage $V_{DD}$, and the operating performance of a succeeding circuit connected to the terminal 2 is enhanced.

In the above, the positive voltage source has been used, and the C-MOS circuit whose load is the P-channel MOS-FET and whose driver is the N-channel MOS-FET has been used. This invention, however, may be constructed by the use of a negative voltage source and a C-MOS circuit employing an N-channel MOS-FET as its load and a P-channel MOS-FET as its driver. (That is, the N-channel MOS-FET's in FIGS. 4 to 6 are replaced with P-channel ones, and the P-channel MOS-FET's with N-channel ones). In this case, a P-N-P bipolar transistor may be used as the transistor 8, and the polarities of the signals may be reversed.

We claim:

1. A tri-state type driver circuit capable of providing "on" and "off" state outputs in response to the state of a driver circuit input signal applied to the driver circuit and a "float" state output which remains constant regardless of the state of said driver circuit input signal, comprising:

an output inverter circuit to provide said three state outputs, which output inverter circuit employs a bipolar transistor as a load thereof and a MOS-FET as a driver thereof, a first logical circuit which is coupled with an input terminal of said bipolar transistor of said output inverter circuit, which first logical circuit is made up of a C-MOS circuit receiving an external select signal and a C-MOS circuit having the driver circuit input signal transmitted thereto, wherein the output of said first logical circuit can be specified by said external select signal, a second logical circuit which is coupled with an input terminal of said MOS-FET of said output inverter circuit, which second logical circuit is made up of a C-MOS circuit receiving said external select signal and a C-MOS circuit having the driver circuit input signal transmitted thereto, wherein the output of said second logical circuit can be specified by said external select signal, and a first C-MOS inverter which is coupled with said second logical circuit and which functions to invert said driver circuit input signal which is applied to said second logical circuit, wherein when the external select signal is in a first state, the first and second logical circuits will produce output signals to set the output of the output inverter circuit to the "float" state output, and when the external select signal is in a second state, the first and second logical circuits will produce output signals to allow the output of the output inverter circuit to be in the "on" or "off" state depending upon the state of the driver input signal.

2. A tri-state type driver circuit according to claim 1, wherein a second C-MOS inverter is disposed between said first logical circuit and said input terminal of said bipolar transistor.

3. A tri-state type driver circuit according to claim 1, wherein a third C-MOS inverter is disposed between said second logical circuit and said input terminal of said MOS-FET.

4. A tri-state type driver circuit according to claim 2, wherein a third C-MOS inverter is disposed between said second logical circuit and said input terminal of said MOS-FET.

5. A tri-state type driver circuit according to claim 1 or 4, wherein said input terminal of said bipolar transistor is a base terminal, and a collector thereof is connected to a power supply.

6. A tri-state type driver circuit according to claim 5, wherein said input terminal of said MOS-FET is a gate terminal, and a source thereof is grounded.

7. A tri-state type driver circuit according to claim 6, wherein an emitter of said bipolar transistor and a drain of said MOS-FET are connected.

8. A tri-state type driver circuit according to claim 1 or 4, wherein said output inverter circuit comprises another MOS-FET whose gate and source are respectively connected to the base and emitter of the bipolar transistor of said output inverter circuit and whose drain is connected to a power supply.

9. A tri-state type driver circuit according to claim 1 or 4, wherein said first logical circuit and said second logical circuit form a NOR circuit for said external select signal and said input signal.

10. A tri-state type driver circuit according to claim 1 or 4, wherein said MOS-FET of said output inverter circuit is an enhancement type MOS-FET.

11. A tri-state type driver circuit according to claim 10, wherein said C-MOS circuits constituting said first logical circuit are composed of enhancement type MOS-FET's.

12. A tri-state type driver circuit according to claim 11, wherein said C-MOS circuits constituting said second logical circuit are composed of enhancement type MOS-FET's.

13. A tri-state type driver circuit according to claim 12, wherein said first C-MOS inverter is composed of enhancement type MOS-FET's.

* * * * *